(12) United States Patent
Katsap et al.

(10) Patent No.: US 6,333,508 B1
(45) Date of Patent: Dec. 25, 2001

(54) ILLUMINATION SYSTEM FOR ELECTRON BEAM LITHOGRAPHY TOOL

(75) Inventors: Victor Katsap, Belle Mead, NJ (US); Pieter Kruit; Daniel Moonen, both of Delft (NL); Warren K Waskiewicz, Clinton, NJ (US)

(73) Assignees: Lucent Technologies, Inc., Murray Hill; eLith LLC, New Providence, both of NJ (US)

( * ) Notice: Subject to any disclaimer, the term of this patent is extended or adjusted under 35 U.S.C. 154(b) by 0 days.

(21) Appl. No.: 09/580,530

(22) Filed: May 30, 2000

Related U.S. Application Data

(63) Continuation-in-part of application No. 09/414,004, filed on Oct. 7, 1999.

(51) Int. Cl.⁷ .............................. H01J 37/302; H01J 1/02; H01J 29/04
(52) U.S. Cl. .................................. 250/492.2; 250/423 R; 313/310; 313/412; 355/53
(58) Field of Search ............................. 250/423 R, 492.3; 313/310, 412; 355/53

(56) References Cited

U.S. PATENT DOCUMENTS

| | | |
|---|---|---|
| 5,258,246 | 11/1993 | Berger et al. . |
| 5,260,151 | 11/1993 | Berger et al. . |

OTHER PUBLICATIONS

"Scanning Thermionic Emission Imaging of Cathode Surfaces" by Sewell et al, SPIE, vol. 3777, Jul. 1999, pp. 125–132.*

Jansen, G.H., "Coulomb interactions in particle beams," published in Nuclear Instrumeents and Methods in Physics Research A298 (Apr. 1990) 496–504 North Holland.

Katsap et al, Mesh–equipped Wehnelt source for SCALPEL (TM), Proc. of SPIE, Conference on Charged Particle Optics IV, Denver, Colorado, Jul. 1999, SPIE vol. 3777 pp. 75–81.

Mkrtchyan et al, "Stochastic scattering in charged particle projection systems: A nearest neighbor approach," J. Appl. Phys. 78 (12), Dec. 15, 1995, pp. 6888–6902.

Jansen, G.H., "Interactions in particle beams", J. Vac. Sci. Technol. B 6 (6), Nov./Dec. 1988, pp1977–1983.

* cited by examiner

*Primary Examiner*—Jack Berman
*Assistant Examiner*—Kalimah Fernandez
(74) *Attorney, Agent, or Firm*—Pillsbury Winthrop LLP

(57) ABSTRACT

A method and apparatus for controlling beam emittance by placing a quadrupole lens array in a drift space of an illumination system component. The illumination system component may be an electron gun or a liner tube or drift tube, attachable to an electron gun. The quadrupole lens array may be three or more mesh grids or a combination of grids and continuous foils. The quadrupole lens array forms a multitude of microlenses resembling an optical "fly's eye" lens. The quadrupole lens array splits an incoming solid electron beam into a multitude of subbeams, such that the outgoing beam emittance is different from the incoming beam emittance, while beam total current remains unchanged. The method and apparatus permit independent control of beam current and beam emittance, which is beneficial in a SCALPEL illumination system.

40 Claims, 12 Drawing Sheets

ILLUMINATION SYSTEM FOR ELECTRON BEAM LITHOGRAPHY TOOL

This is a Continuation-in-Part of application Ser. No. 09/414,004 filed on Oct. 7, 1999, the entire content of which is hereby incorporated by reference.

FIELD OF THE INVENTION

This invention relates to an illumination system for an electron beam lithography apparatus used for the manufacture of semiconductor integrated circuits and a lithographic apparatus having such an illumination system.

BACKGROUND OF THE INVENTION

Electron beam exposure tools have been used for lithography in semiconductor processing for more than two decades. The first e-beam exposure tools were based on the flying spot concept of a highly focused beam, raster scanned over the object plane. The electron beam is modulated as it scans so that the beam itself generates the lithographic pattern. These tools have been widely used for high precision tasks, such as lithographic mask making, but the raster scan mode is found to be too slow to enable the high throughput required in semiconductor wafer processing. The electron source in this equipment is similar to that used in electron microscopes, i.e., a high brightness source focused to a small spot beam.

More recently, a new electron beam exposure tool was developed based on the SCALPEL (SCattering with Angular Limitation Projection Electron-beam Lithography) technique. In this tool, a wide area electron beam is projected through a lithographic mask onto the object plane. Since relatively large areas of a semiconductor wafer (e.g., 1 mm$^2$) can be exposed at a time, throughput is acceptable. The high resolution of this tool makes it attractive for ultra fine line lithography, i.e., sub-micron.

The requirements for the electron beam source in SCALPEL exposure tools differ significantly from those of a conventional focused beam exposure tool, or a conventional TEM or SEM. While high resolution imaging is still a primary goal, this must be achieved at relatively high (10–100 $\mu$A) gun currents in order to realize economic wafer throughput. The axial brightness required is relatively low, e.g., $10^2$ to $10^4$ Acm$^{-2}$sr$^{-1}$, as compared with a value of $10^6$ to $10^9$ Acm$^{-2}$sr$^{-1}$ for a typical focused beam source. However, the beam flux over the larger area must be highly uniform to obtain the required lithographic dose latitude and CD control.

A formidable hurdle in the development of SCALPEL tools was the development of an electron source that provides uniform electron flux over a relatively large area, has relatively low brightness, and high emittance, defined as $D*\alpha$ micron*milliradian, where D is beam diameter, and $\alpha$ is divergence angle. Conventional, state-of-the-art electron beam sources generate beams having an emittance in the 0.1–400 micron*milliradian range, while SCALPEL-like tools require emittance in the 1000 to 5000 micron*milliradian range.

Further, conventional SCALPEL illumination system designs have been either Gaussian gun-based or grid-controlled gun-based. A common drawback of both types is that beam emittance depends on actual Wehnelt bias, which couples beam current control with inevitable emittance changes. From a system viewpoint, independent control of the beam current and beam emittance is much more beneficial.

SUMMARY OF THE INVENTION

The present invention is directed to a charged particle illumination system component for an electron beam exposure tool and an electron beam exposure tool that provides independent emittance control by placing a lens array, which acts as an "emittance controller", in the illumination system component. In one embodiment, a conductive mesh under negative bias is placed in the SCALPEL lithography tool kept at ground potential, forming a multitude of microlenses resembling an optical "fly's eye" lens. The mesh forms an array of electrostatic lenslets that splits an incoming solid electron beam into a multitude of subbeams, such that the outgoing beam emittance is different from the incoming beam emittance, while beam total current remains unchanged. The mesh enables beam emittance control without affecting beam current. In another embodiment, the illumination system component is an electron gun. In yet another embodiment, the illumination system component is a liner tube, connectable to a conventional electron gun.

The optical effect of a mesh grid may be described in geometrical terms: each opening in the mesh acts as a microlens, or lenslet, creating its own virtual source, or cross-over, having diameter d, on one side of the mesh grid. Each individual subbeam takes up geometrical space close to L, where L equals the mesh pitch. The beam emittance ratio after the mesh grid to the one created by the electron gun, equals $$r=(L/d)^2.$$

In another embodiment of the present invention, a mesh grid includes multiple (for example, two, three, or more) meshes. In an odd numbered configuration (greater than one), the outward two meshes may have a curved shape; such a lens would enable beam emittance control and also reduce spherical aberration.

In another embodiment of the present invention, the lens array is a continuous lens made of foil.

In another aspect of the invention, the beam controller provides an array of quadrupole electrostatic lenslets. In a preferred embodiment, the quadrupole electrostatic lenslets are formed by three planar meshes that are in spaced parallel relation. These meshes are each formed by a plurality of parallel wires The invention is also directed to a method of controlling the emittance of a charged particle beam by passing the beam through an array of quadrupole electrostatic field patterns and a method of producing semiconductor devices including passing the beam through an array of quadrupole electrostatic field patterns.

Other objects and advantages of the invention will be appreciated from the following description of the drawings and the appended claims.

DETAILED DESCRIPTION

Figure 1:
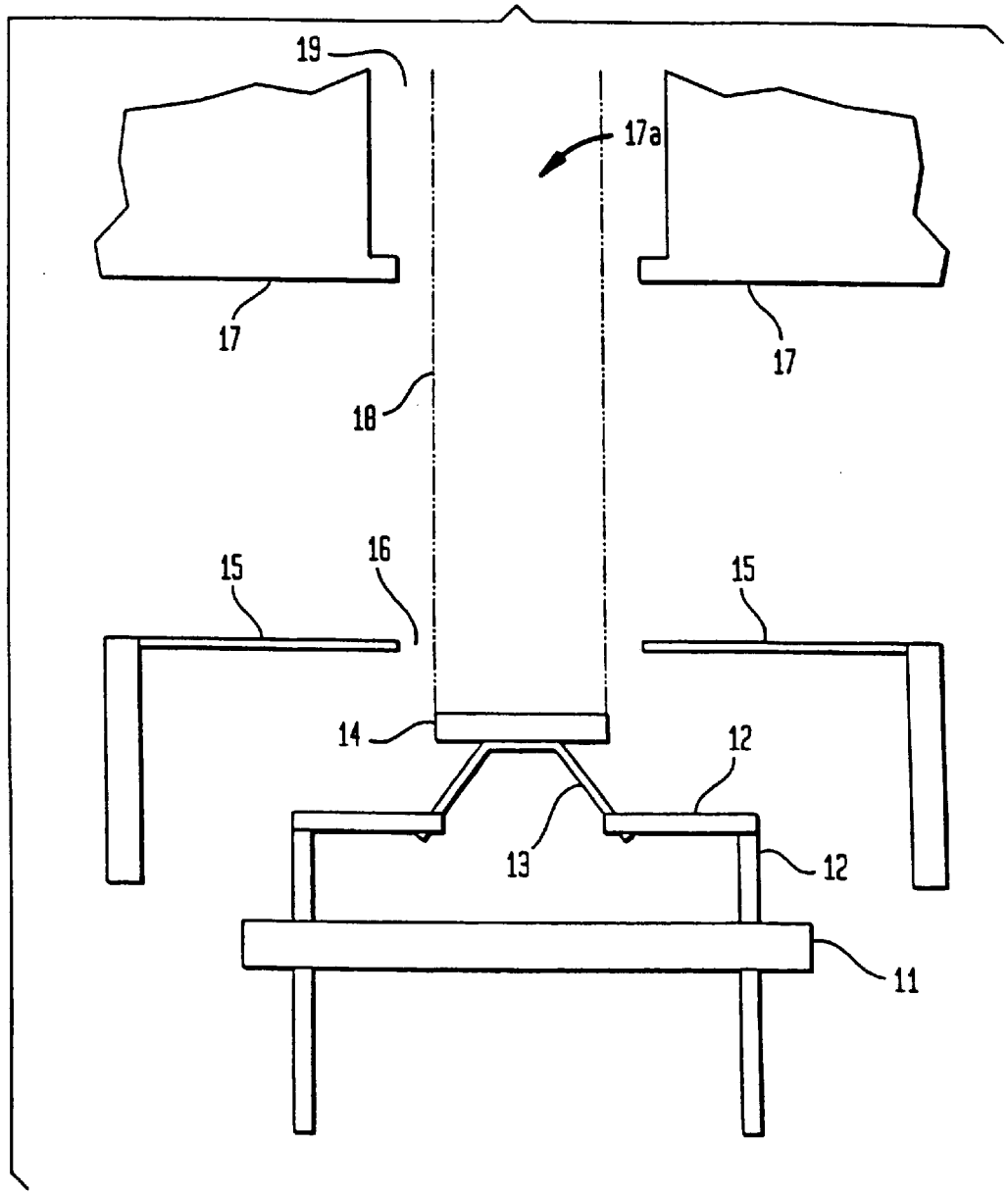
FIG. 1 is a schematic diagram of one conventional Wehnelt electron gun with a tantalum disk emitter.

Referring to FIG. 1, a conventional Wehnelt electron gun assembly is shown with base 11, cathode support arms 12, cathode filament 13, a Wehnelt electrode including Wehnelt horizontal support arms 15 and conventional Wehnelt aperture 16. The base 11 may be ceramic, the support members 12 may be tantalum, steel, or molybdenum. The filament 13 may be tungsten wire, the material forming the Wehnelt support arms 15 may be steel or tantalum, and the electron emitter 14 is, e.g., a tantalum disk. The effective area of the electron emitter is typically in the range of 0.1–5.0 mm$_2$. The electron emitter 14 is preferably a disk with a diameter in the range of 0.05–3.0 mm. The anode is shown schematically at 17, including anode aperture 17a, the electron beam at 18, and a drift space at 19. For simplicity the beam control apparatus, which is conventional and well known in the art, is not shown. It will be appreciated by those skilled in the art that the dimensions in the figures are not necessarily to scale. An important feature of the electron source of SCALPEL exposure tools is relatively low electron beam brightness, as mentioned earlier. For most effective exposures, it is preferred that beam brightness be limited to a value less than $10^5$ Acm$^{-2}$sr$^{-1}$. This is in contrast with conventional scanning electron beam exposure tools which are typically optimized for maximum brightness. See e.g., U.S. Pat. No. 4,588,928 issued May 13, 1986 to Liu et al.

Figure 2:
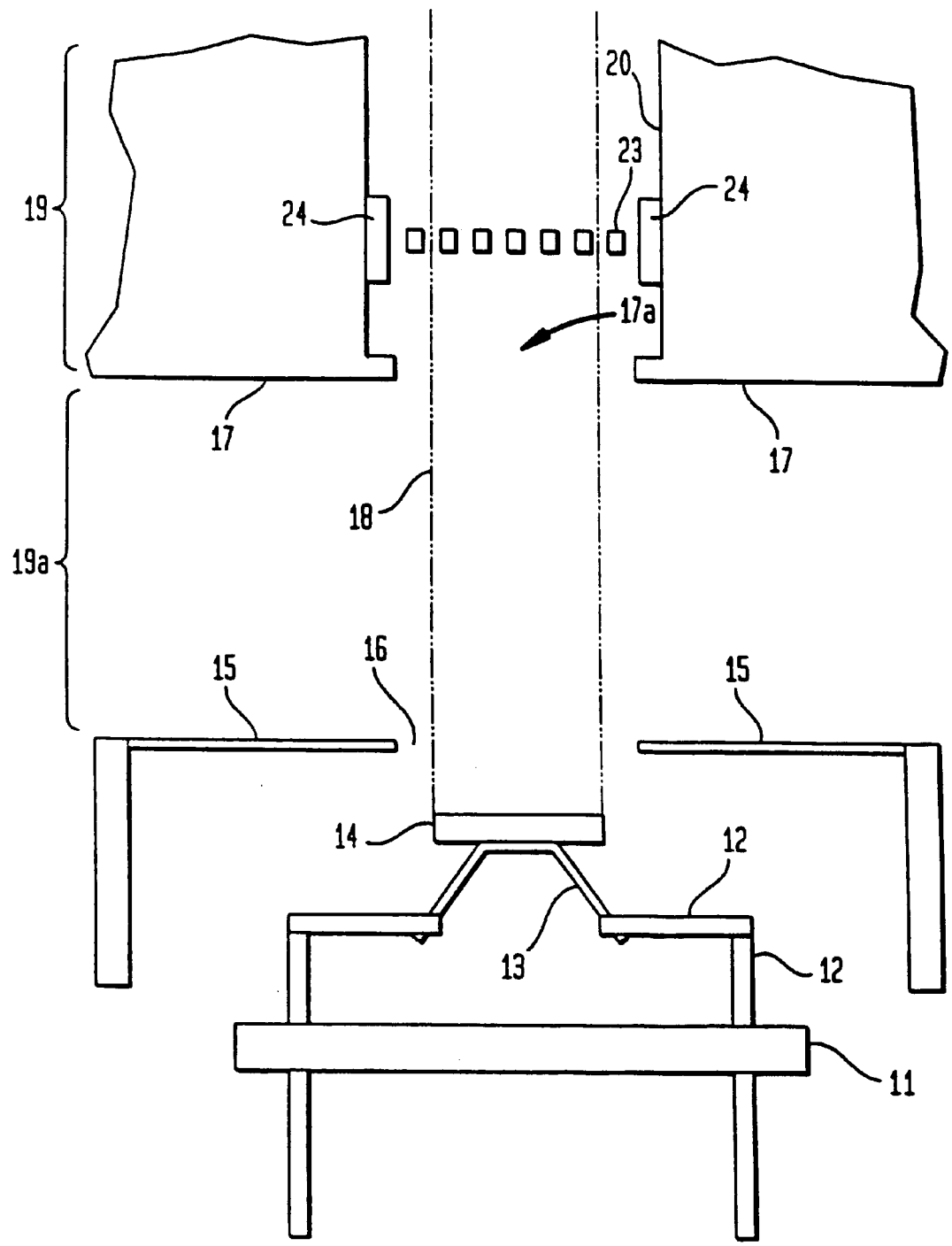
FIG. 2 is a schematic diagram of an electron gun modified in accordance with the invention.

The present invention is shown in FIG. 2. A mesh grid 23 is disposed in the path of the electron emission 18 in the drift space 19. According to FIG. 2, the mesh grid 23 is placed in the electrostatic field-free drift space 19, insulated from the drift tube, or liner 20, and it is biased to a specified potential Um. The potential difference between the mesh grid 23 and the liner 20 creates microlenses out of each opening in the mesh grid 23. The electron beam 18 is split into individual subbeams (beainlets), and each beamlet is focused moving through its respective mesh cell, or microlens. The mesh grid 23 is separated from the liner 20 by an insulator 24. The mesh grid 23 and the insulator 24 may both be part of a mesh holder.

One characteristic of the drift space 19 is that there is substantially no or no electric field present. The substantial absence of the electric field results in no acceleration or deceleration of electrons, hence the electrons are permitted to "drift", possibly in the presence of a magnetic field. This in contrast to the vacuum gap 19a, which has a strong electric field.

Figure 2A:
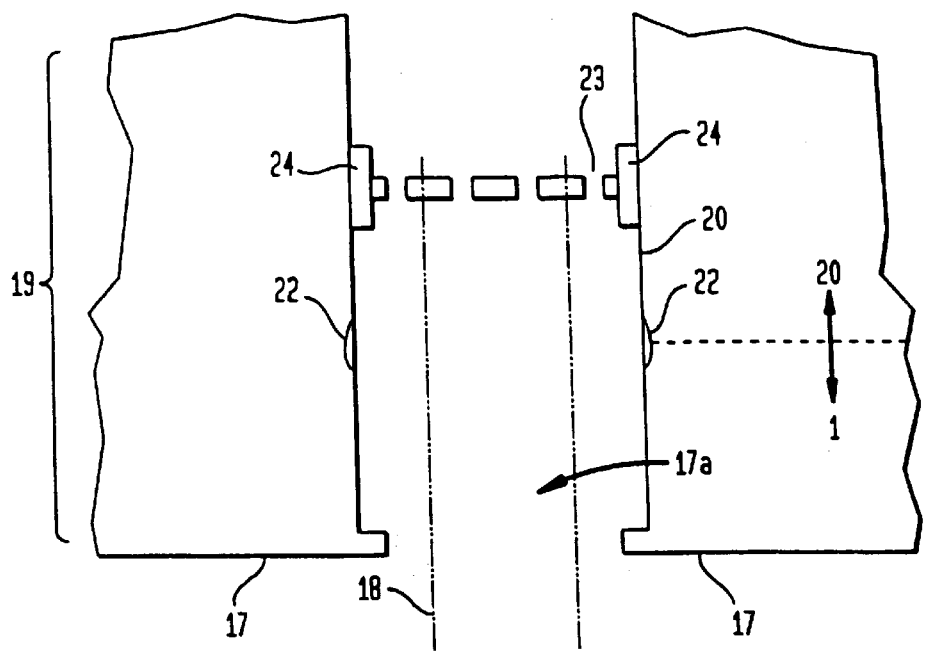
FIGS. 2(a) and 2(b) illustrate variations of the present invention.
Figure 2B:
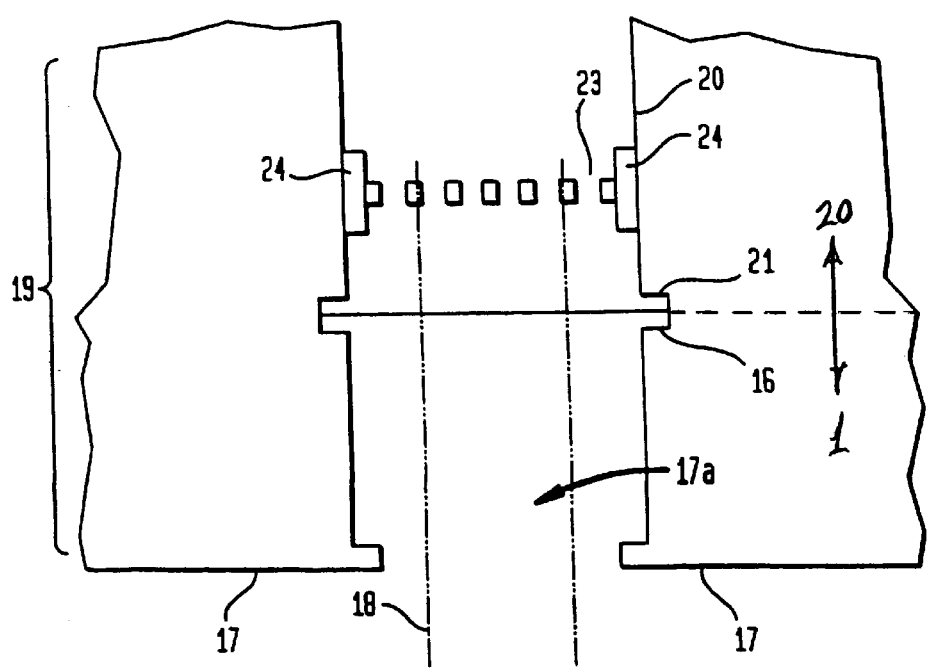

FIGS. 2(a) and 2(b) illustrate variations on FIG. 2. In particular, FIGS. 2(a) and 2(b) both show the mesh grid 23 within a liner 20 attached to an electron gun assembly 1. In FIG. 2(b), the liner 20 is attached to the electron gun assembly 1 via a liner flange 21 and an electron gun flange 16. In FIG. 2(a), the liner 20 is attached to the electron gun assembly 1 at weld 22. The liner 20 and electron gun assembly 1 could be attached by other techniques known to one of ordinary skill in the art, as long as the attachment is vacuum tight. Alternatively, the mesh grid 23 could be placed below the boundary between the liner flange 21 and the electron gun flange 16 or below the weld 22, within the electron gun assembly 1, as long as the mesh grid 23 remains within the drift space 19.

Figure 2C:
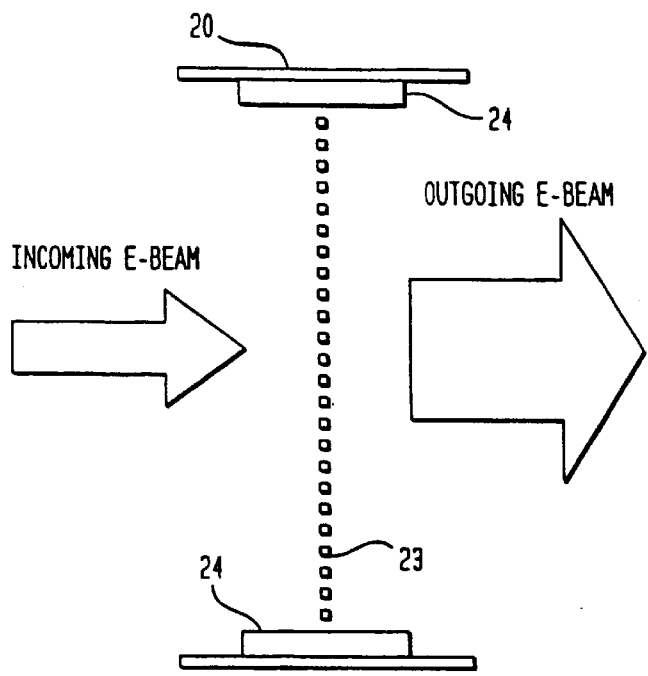
FIG. 2(c) illustrates the effect of the mesh grid on the electron beam.

One advantage of the embodiments illustrates in FIGS. 2(a) and 2(b) is that they permit the use of conventional non-optimal electron guns. A conventional electron gun produces a beam which is too narrow and too non-uniform. The arrangements in FIGS. 2(a) and 2(b) permit increased performance utilizing a conventional electron gun, since the mesh grid 23 contained within the liner 20 improves the beam emittance by making it wider and more uniform, which is more suitable for SCALPEL applications. The effect of the mesh grid 23 is more clearly illustrated in FIG. 2(c).

Figure 3:
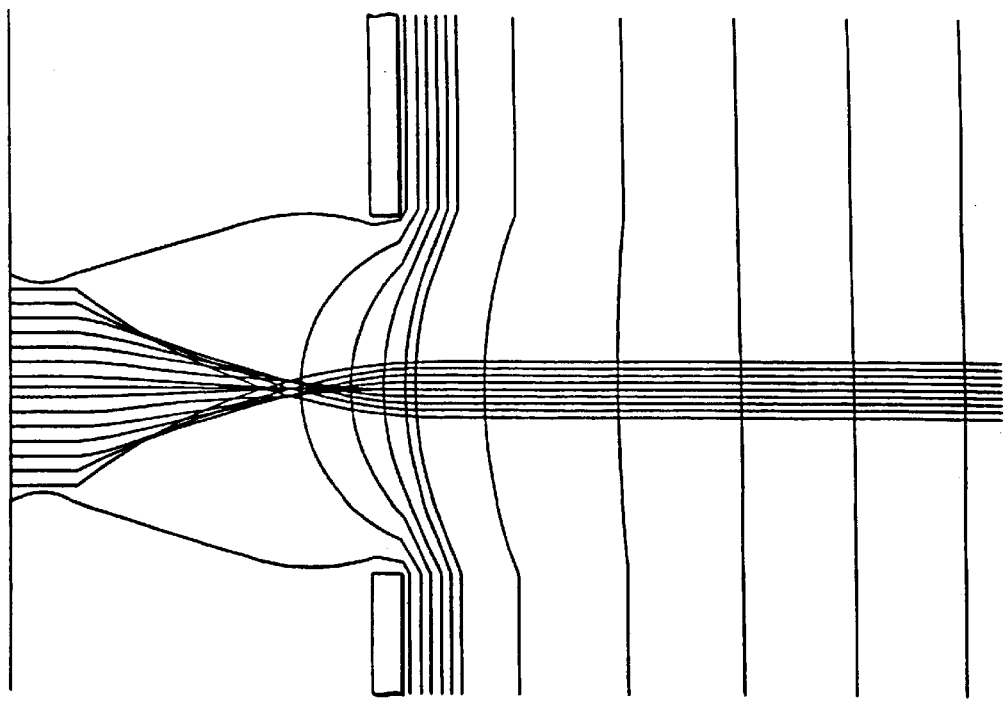
FIG. 3 is a schematic representation of the electron emission profile from the conventional Wehnelt electron gun.
Figure 4:
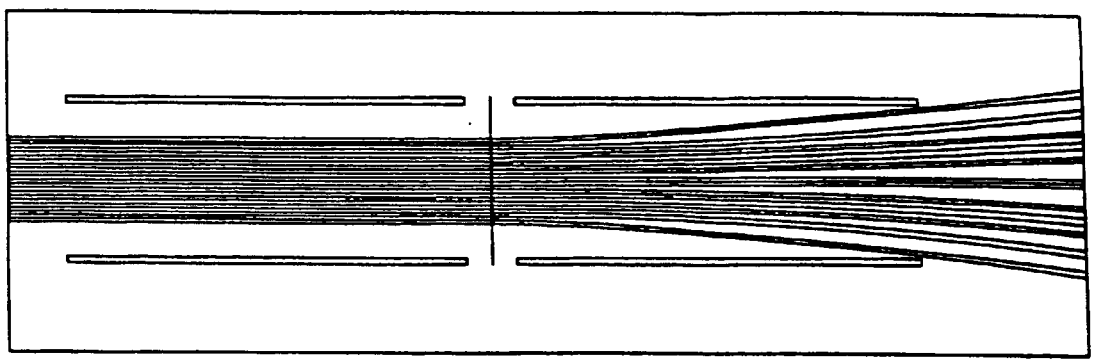
FIG. 4 illustrates the effect of the mesh grid in one embodiment of the present invention.

The electron emission pattern from the Wehnelt gun of FIG. 1, is shown in FIG. 3. The relatively non-uniform, bell curve shaped output from the Wehnelt is evident. FIG. 4 illustrates the electron beam emittance through the mesh grid 23. The emittance on the left side of the mesh grid 23 is low, whereas after passing through the mesh grid 23, the emittance of the electron beam is much higher.

The screen element that forms the mesh grid 23 can have a variety of configurations. The simplest is a conventional woven screen with square apertures. However, the screen may have triangular shaped apertures, hexagonal close packed apertures, or even circular apertures. It can be woven or non-woven. Techniques for forming suitable screens from a continuous layer may occur to those skilled in the art. For example, multiple openings in a continuous metal sheet or foil can be produced by technique such as laser drilling. Fine meshes can also be formed by electroforming techniques. The mesh grid 23 should be electrically conducting but the material of the mesh is otherwise relatively inconsequential. Tantalum, tungsten, molybdenum, titanium, or even steel are suitable materials, as are some alloys as would be known to one skilled in the art. The mesh grid 23 preferably has a transparency in the range of 40–90%, with transparency defined as the two dimensional void space divided by the overall mesh grid area.

Figure 4A:
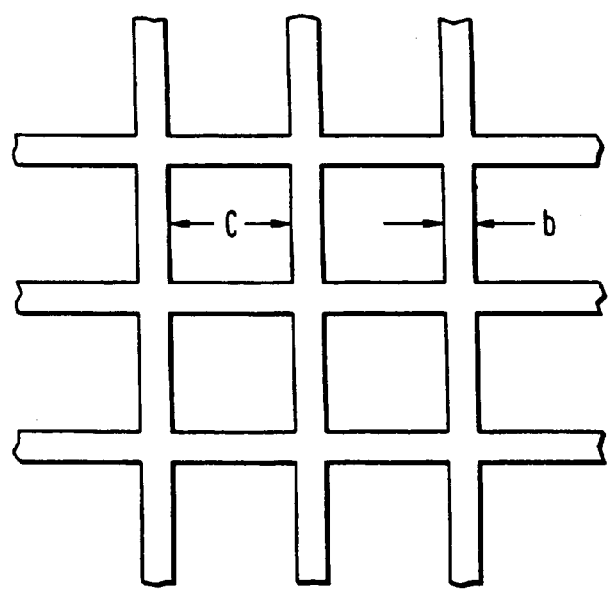
FIG. 4(a) is a schematic diagram of a mesh grid of the invention showing the relevant dimensions.

With reference to FIG. 4(a), the mesh grid has bars "b" of approximately 50 μm, and square cells with "C" approximately 200 μm. This mesh grid has a transparency of approximately 65%. Examples of mesh grid structures that were found suitable are represented by the examples in the following table.

TABLE I

|         | Cell dimension "C", μm | Bar width "b", μm |
|---------|------------------------|-------------------|
| Grid #1 | 200                    | 50                |
| Grid #2 | 88                     | 37                |
| Grid #3 | 54                     | 31                |

The cell dimension "C" is the width of the opening in a mesh with a square opening. For a rectangular mesh grid the dimension "C" is approximately the square root of the area of the opening. It is preferred that the openings be approximately symmetrical, i.e., square or round.

The thickness t of the mesh grid is relatively immaterial except that the aspect ratio of the openings, C/t, is preferably greater than 1. A desirable relationship between the mesh grid parameters is given by:

$$C{:}t > 1.5$$

In yet another embodiment, the lens array may include more than one mesh. In one embodiment, the lens array includes three meshes. The outer two meshes may be prepared having curved shape; such a lens would provide beam emittance control and decrease spherical aberration.

In addition the outer two meshes may also be replaced with foils, such as an SiN foil, with a thickness of approximately 0.1 μm. Such a film (foil) would permit substantially no physical interaction (inelastic collisions), and therefore a transparency approaching 100%. Due to the large current being passed through the lens array (either mesh or continuous), the transparency is important. If a high percentage of the beam impacts the structure of the mesh or continuous film, the high current is likely to melt the mesh or continuous film.

Figure 5:
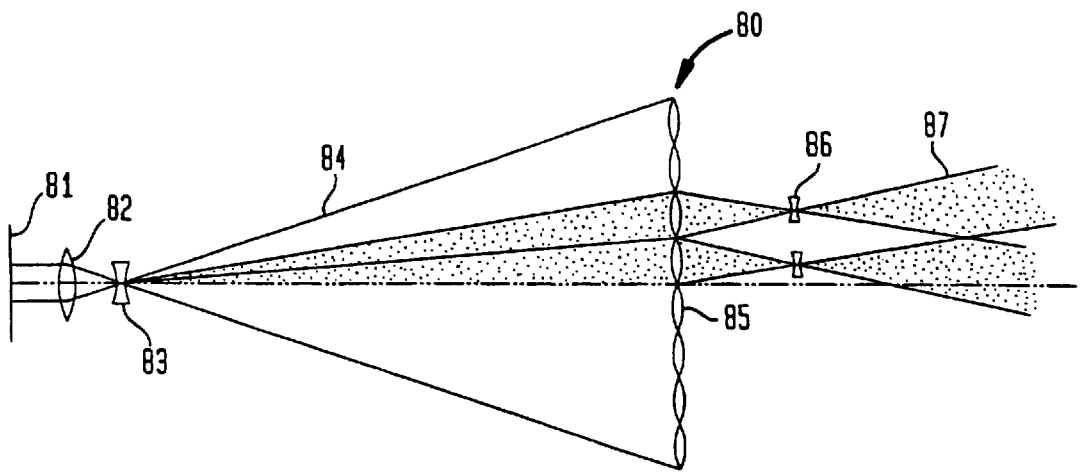
FIG. 5 is a more general representation of the optics of the present invention.

FIG. 5 is a more general representation of the optics of the present invention. 81 is the cathode of a standard high brightness electron gun, either a W hairpin, or a LaB$_6$ crystal or a BaO gun as used in for example a CRT. 82 is the gun lens formed by the Wehnelt electrode and the extraction field. 83 is the gun cross-over with diameter dg. 84 is the electron beam emerging from the gun, with half aperture angle $\alpha_g$ as they appear looking back from where the beam has been accelerated to 100 kV. The emittance of the gun is now $$E = \frac{\pi^2}{4} d_g^2 \alpha_g^2$$

After the beam has spread out to a diameter which is considerably larger than the diameter of the lenslets 85, the lens array 80 is positioned. Each lenslet 85 creates an image 86 of the gun cross-over with size $d_i$. Each subbeam 87 now has a half opening angle $\alpha_i$.

The emittance increase created by the lens array 80 can be derived. Liouvilles theorem states that the particle density in six dimensional phase space cannot be changed using conservative forces such as present in lenses. This implies that the emittance within each subbeam that goes through one lenslet is conserved and thus:

$$N \cdot \frac{\pi^2}{4} d_i^2 \quad \alpha_i^2 = \frac{\pi^2}{4} d_g^2 \alpha_g^2$$

where N is the number of subbeams.
The emittance of the beam appears to be $$N \cdot \frac{\pi^2}{4} L^2 \alpha_i^2$$

where L is the pitch of the lenslets 85 and thus $$N \cdot \frac{\pi^2}{4} L^2$$

is the total area of the lens array 80. The new emittance of the beam is termed the effective emittance. The emittance increase is $E_{eff}/E_{gun} = L^2/d_i^2$.

It is not necessary to create a real cross-over with the lenslet array. The calculation of the emittance increase then proceeds differently, but the principle still works.

For a large emittance increase, it is beneficial to use a large pitch of the mesh grid 23. However, the newly formed beam should include a reasonably large number of subbeams so that the subbeams will overlap at essential positions in the system such as the mask. Example 1 illustrates typical values.

EXAMPLE 1

A LaB$_6$ gun of 0.2 mm diameter is used. The cross-over after the gun lens could be 60 μm, thus the emittance increase is a factor of eight using Grid #1 in Table 1.

Figure 6:
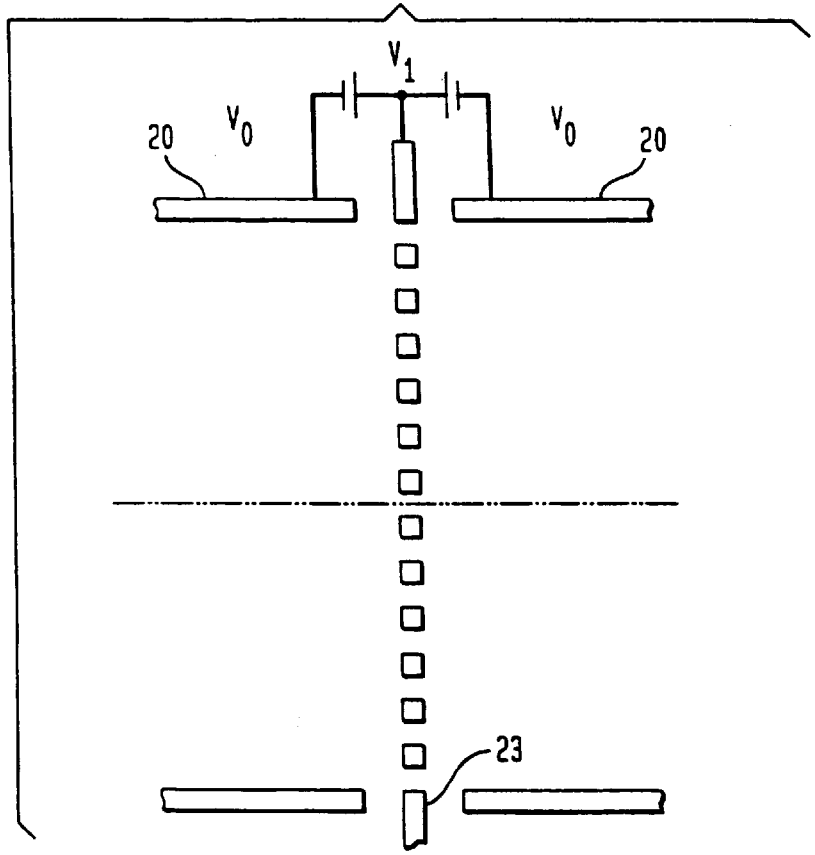
FIG. 6 illustrates the potential across the mesh grid.
Figure 6A:
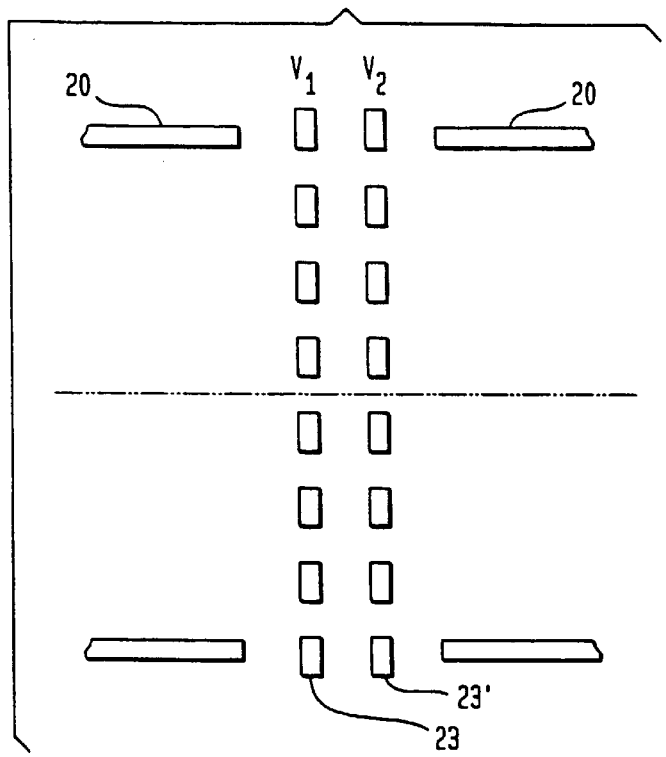
FIGS. 6(a) and 6(b) illustrate the potential across alternative mesh grid arrangements.
Figure 6B:
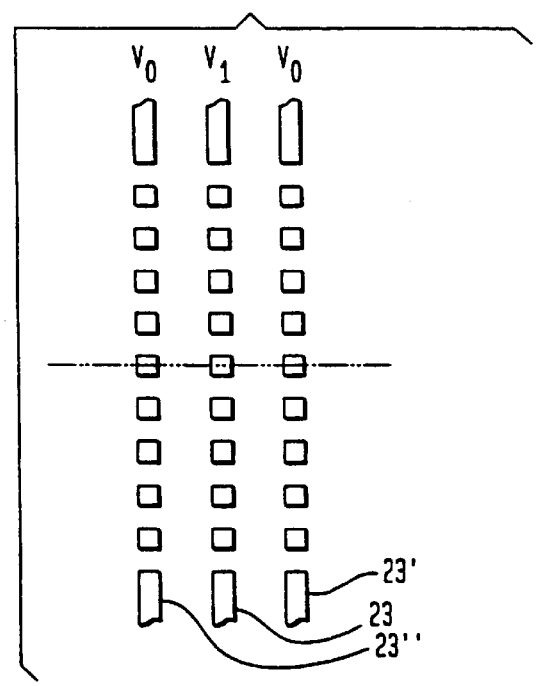

The lens array 80 may be the mesh grid 23 at potential V$_1$, between liner 20 at potential V$_0$ as shown in FIG. 6, or include two grids 23 and 23' at the potentials illustrated in FIG. 6(a) or three grids 23, 23', 23" at the potentials illustrated in FIG. 6(b), or any other configuration which contains a grid mesh with an electrostatic field perpendicular to the gridplane.

The focal distance of the lenslets 85 in FIG. 5 is typically in the order of 4× Vacc/Efield, where Vacc is the acceleration potential of the electron beam and Efield the strength of the electrostatic field. In Example 1, the distance between the gun cross-over and the lens array could be typically 100 mm, calling for a focal length of about 50 mm to create demagnified images. Thus, at 100 kV acceleration, the field should be 10 kV/mm.

In an alternative embodiment, if a specific configuration requires a strong field, the mesh grid 23 could be incorporated in the acceleration unit of the gun, between the cathode and the anode. This would have the additional advantage that the beam has not yet been accelerated to the fall 100 kV at that point.

In an alternative embodiment, the mesh grid 23 could also be incorporated in the electron gun in the Wehnelt-aperture 16 of FIG. 2. The mesh pitch must again be much smaller than the cathode diameter. This would lead to lenslet sizes in the order of μm's.

Figure 7:
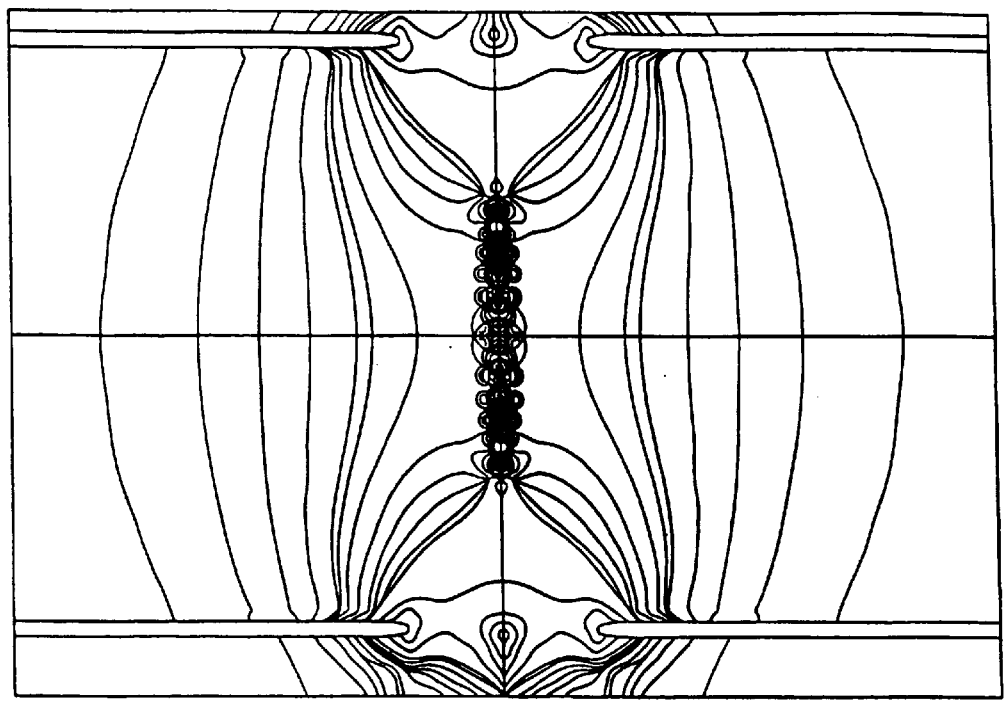
FIG. 7 illustrates the equipotential fields around a mesh grid, calculated by the SOURCE computer simulation model with a bias voltage of −40 kV.

The present invention has been confirmed by computer simulation with both Charged Particle Optics (CPO, Bowring Consultant, Ltd., and Manchester University) and SOURCE (by MEBS, Ltd.) models. In the SOURCE model, the mesh grid 23 is approximated by a series of circular slits. In both the CPO and SOURCE programs, a lens including two grounded cylinders with a biased mesh in the gap between those cylinders is simulated. FIG. 7 shows a detail of the SOURCE model, with fields. The lensfields are clearly visible in the openings in the mesh.

Figure 8:
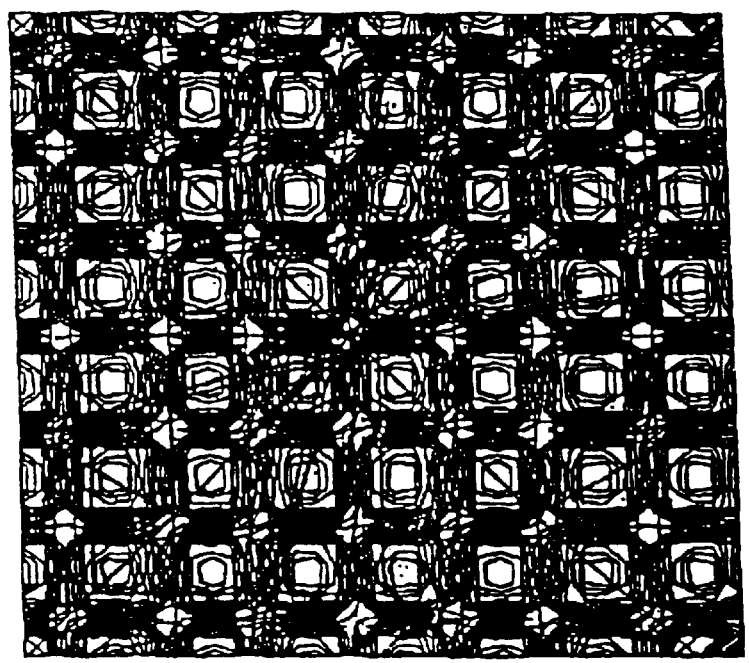
FIG. 8 illustrates the multi lens effect in the mesh grid, calculated using the CPO3d computer simulation model with a bias voltage of −40 kV.

Further, the modeling has been done with a three-dimensional simulation program CPO3d. FIG. 8 illustrates the potential distribution in the plane of the mesh. Again, the multi-lens effect in the mesh grid can be clearly seen.

As indicated above the electron gun of the invention is most advantageously utilized as the electron source in a SCALPEL electron beam lithography machine. Fabrication of semiconductor devices on semiconductor wafers in current industry practice contemplates the exposure of polymer resist materials with fine line patterns of actinic radiation, in this case, electron beam radiation. This is achieved in conventional practice by directing the actinic radiation through a lithographic mask and onto a resist coated substrate. The mask may be positioned close to the substrate and the image of the mask projected onto the substrate for projection printing.

SCALPEL lithography tools are characterized by high contrast patterns at very small linewidths, i.e., 0.1 $\mu$m or less. They produce high resolution images with wide process latitude, coupled with the high throughput of optical projection systems. The high throughput is made possible by using a flood beam of electrons to expose a relatively large area of the wafer. Electron beam optics, comprising standard magnetic field beam steering and focusing, are used to image the flood beam onto the lithographic mask, and thereafter, onto the substrate, i.e., the resist coated wafer. The lithographic mask is composed of regions of high electron scattering and regions of low electron scattering, which regions define the features desired in the mask pattern. Details of suitable mask structures can be found in U.S. Pat. No. 5,079,112 issued Jan. 7, 1992, and U.S. Pat. No. 5,258,246 issued Nov. 2, 1993, both to Berger et al., the entire contents of both are incorporated herein by reference.

An important feature of the SCALPEL tool is the back focal plane filter that is placed between the lithographic mask and the substrate. The back focal plane filter functions by blocking the highly scattered electrons while passing the weakly scattered electrons, thus forming the image pattern on the substrate. The blocking filter thus absorbs the unwanted radiation in the image. This is in contrast to conventional lithography tools in which the unwanted radiation in the image is absorbed by the mask itself, contributing to heating and distortion of the mask, and to reduced mask lifetime.

Figure 9:
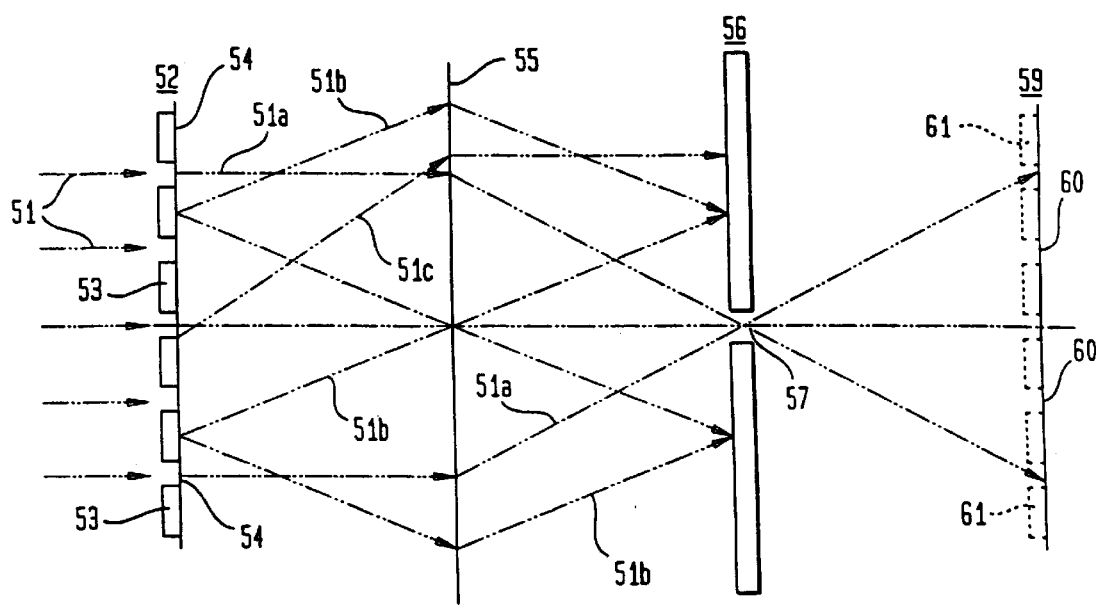
FIG. 9 is a schematic diagram illustrating the principles of the SCALPEL exposure system.

The principles on which SCALPEL lithography systems operate are illustrated in FIG. 9. Lithographic mask 52 is illuminated with a uniform flood beam 51 of 100 keV electrons produced by the electron gun of FIG. 2. The membrane mask 52 comprises regions 53 of high scattering material and regions 54 of low scattering material. The weakly scattered portions of the beam, i.e., rays 51a, are focused by magnetic lens 55 through the aperture 57 of the back focal plane blocking filter 56. The back focal plane filter 56 may be a silicon wafer or other material suitable for blocking electrons. The highly scattered portions of the electron beam, represented here by rays 51b and 51c, are blocked by the back focal plane filter 56. The electron beam image that passes the back focal plane blocking filter 56 is focused onto a resist coated substrate (or "workpiece") located at the optical plane represented by 59. Regions 60 replicate the features 54 of the lithographic mask 52, i.e., the regions to be exposed, and regions 61 replicate the features 53 of the lithographic mask, i.e., the regions that are not to be exposed. These regions are interchangeable, as is well known in the art, to produce either negative or positive resist patterns.

A vital feature of the SCALPEL tool is the positioning of a blocking filter at or near the back focal plane of the electron beam image. Further details of SCALPEL systems can be found in U.S. Pat. No. 5,079,112 issued Jan. 7, 1992, and U.S. Pat. No. 5,258,246 issued Nov. 2, 1993, both to Berger et al, incorporated by reference above. These patents are incorporated herein by reference for such details that may be found useful for the practice of the invention.

Figure 9A:
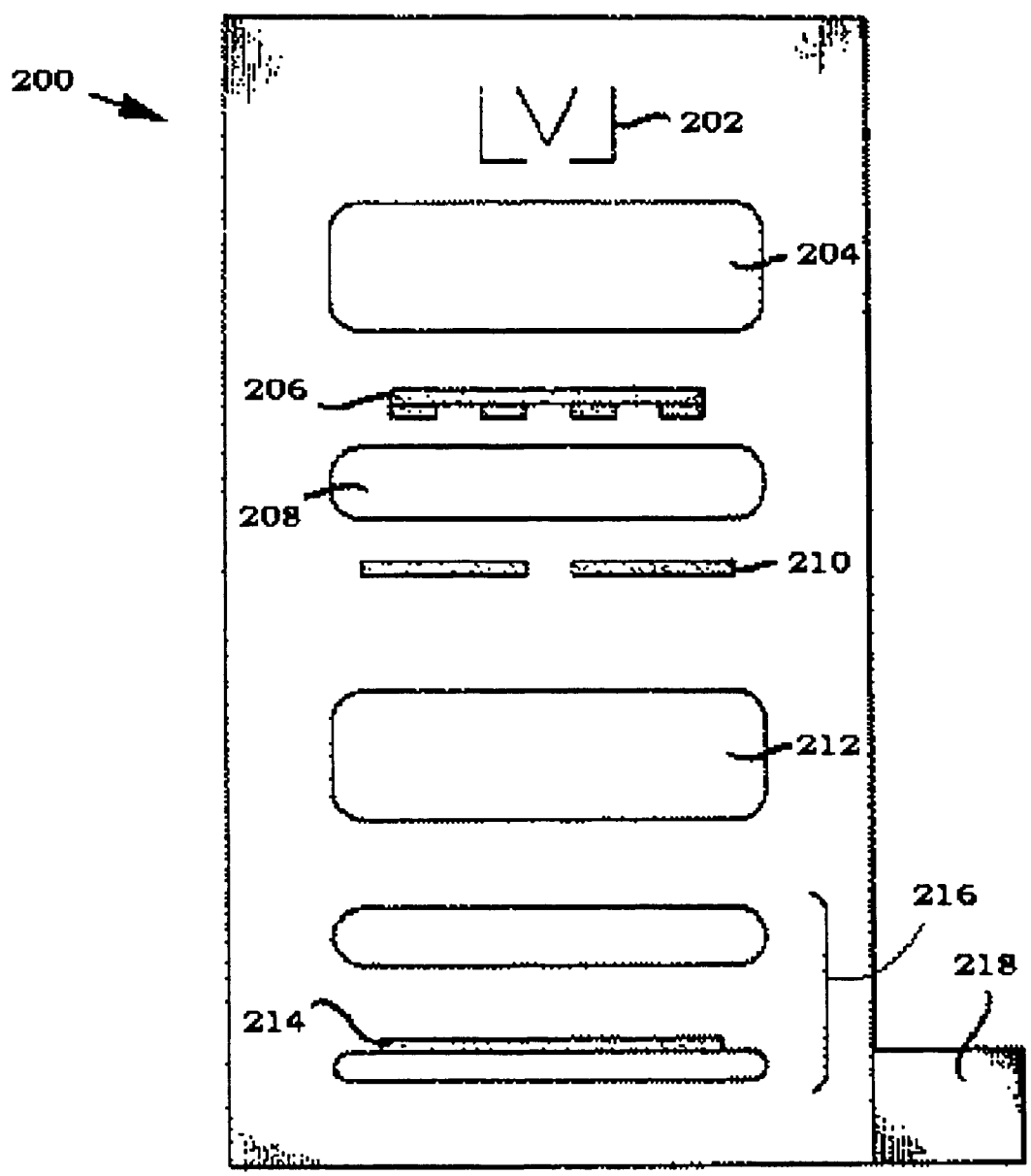
FIG. 9A is a schematic illustration of the general features of a lithographic apparatus according to a preferred embodiment of the invention.

U.S. Pat. No. 5,258,246 incorporated by reference above describes the general features of an electron beam lithographic apparatus 200 illustrated in FIG. 9A. The electron beam lithographic apparatus 200 has a source of accelerated electrons 202, a condenser lens system 204, a mask 206 mounted on a mask holder, an objective lens system 208, a back focal plane filter 210, a projection lens system 212, and an exposure medium 214 mounted on a substrate holder, in that order along the electron beam path. The electron beam lithographic apparatus 200 typically includes a registration and alignment system 216. A chamber contains all components along the path of the electron beam, which chamber is maintained at vacuum by use of a vacuum pump 218.

Figure 10:
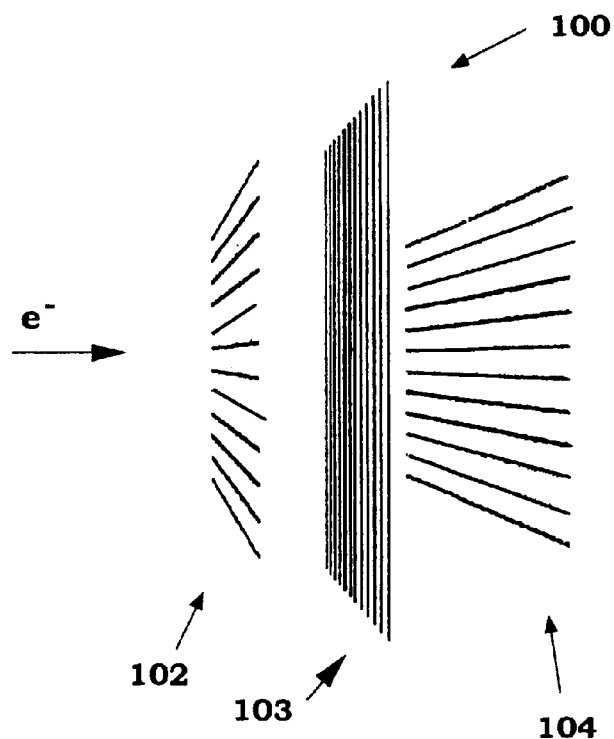
FIG. 10 is a schematic illustration of a preferred embodiment of a charged particle beam emittance controller according to the invention.

Another preferred embodiment of the invention includes many features identical to those recited above in regard to other preferred embodiments of the invention described with reference to FIGS. 2 through 9. Rather than a mesh grid, however, this embodiment of the invention employs a charged particle beam emittance controller 100 having a structure that forms a plurality of electrostatic quadrupole patterns. A person skilled in the art can appreciate, in view of the teachings herein, that there are numerous ways in which one can produce quadrupole field patterns through the use of conductors that can form an electrostatic charge. In the preferred embodiment, the structure of the emittance controller 100 comprises a plurality (preferably three) of planar meshes, indicated as 102, 103 and 104 in FIG. 10. The wires of the outer meshes 102 and 104 extend in the y-axis direction, while the wires of the inner mesh 103 extend in the x-axis direction. The basic principles of the charged particle beam emittance controller are the same whether the charged particle beam is an electron beam or other type of charged particle beam such as a beam of atomic ions. A beam of electrons is preferred for the present application. However, the general concepts of the invention contemplate applications to charge particle beams other than just electron beams.

The charged particle emittance controller 100 is disposed in a beam of charged particles, preferably electrons, yielding an outgoing beam of charged particles having a modified emittance. The beam of charged particles is passed through the quadrupole field patterns produced by the emittance controller to cause portions of the charged particle beam to converge, thus forming a plurality of secondary charged particle sources (effective sources). In a preferred embodiment, the charged particle beam emittance controller 100 is disposed in drift space 19 connected by insulators 24 to liner 20 (see FIG. 2). In the preferred embodiment, the charged particle beam emittance controller 100 replaces the mesh grid 23 illustrated in FIG. 2. Similarly, the charged particle beam emittance controller 100 replaces the mesh grids 23, 23', 23" in other preferred embodiments illustrated in FIGS. 2A, 2B, 2C, 6, 6A and 6B. Similar to the mesh grids 23, 23', 23", the charged particle beam emittance controller 100 may also be incorporated in the electron gun in the Wehnelt aperture 16 illustrated in FIG. 2.

Figure 11A:
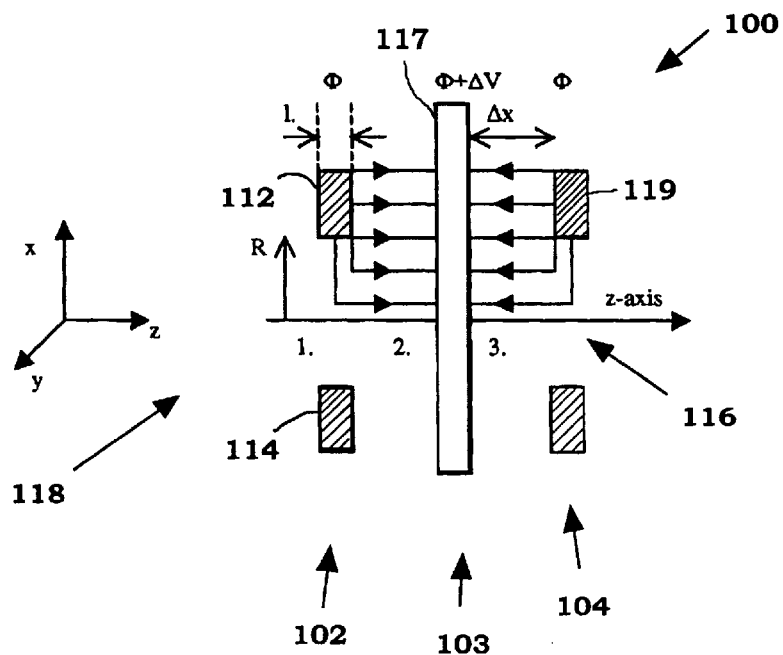
FIG. 11A is a top view, in cross section of a portion of a charged particle beam emittance controller according to a preferred embodiment of the invention.

FIG. 11A illustrates a portion of a charged particle beam emittance controller 100 in a preferred embodiment of the invention. FIG. 11A is a cross-sectional view (in the X,Z plane) of a portion of the charged particle beam emittance controller viewed from the top.

Figure 11B:
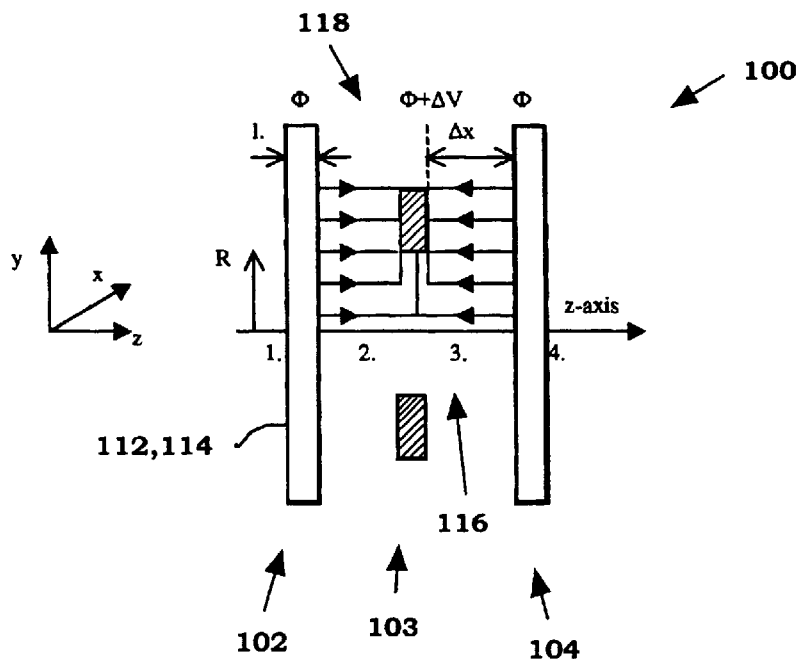
FIG. 11B is a side cross sectional view corresponding to FIG. 11A.

FIG. 11B is a cross-sectional side view (in the Y,Z plane) corresponding to the portion of the charged particle beam emittance controller 100 illustrated in FIG. 11A. As shown, first outer wire mesh 102 and second outer wire mesh 104 are planar and arranged substantially parallel to each other. The inner wire mesh 103 also has a substantially planar form and is arranged between and substantially parallel to the first and second outer wire meshes 102, 104. Preferably, the distance between the inner wire mesh 103 and first outer wire mesh 102 is substantially equal to the distance between the inner wire mesh 103 and second outer wire mesh 104.

In the preferred embodiment, the first outer wire mesh 102 has a plurality of conductive members, only two of which are illustrated and labeled with reference numbers 112 and 114. Preferably, conductive members 112 and 114 are metal wires or bars having a rectangular cross-section. Preferably, the metal wires or bars of the first outer wire mesh 102 each have a longitudinal axis extending along the respective centers (perpendicular to the page of FIG. 11A for the bars 112 and 114 illustrated). The longitudinal axes of the wires or metal bars of the first outer wire mesh 102 extend along the vertical direction in the plane of the page for the bars 112 and 114 illustrated in FIG. 11B. Preferably, each of the metal wires in the first outer wire mesh 102 have substantially equal dimensions and are spaced substantially equal distances apart.

In the preferred embodiment, the second outer mesh 104 has a substantially identical construction and arrangement as that of first outer mesh 102. In the preferred embodiment, the inner wire mesh 103 has a substantially identical construction to that of the first and second outer wire meshes 102, 104, but it is rotated 90 degrees with respect to the first and second outer wire meshes 102, 104, as illustrated in FIGS. 11A and 11B.

A voltage source, or voltage sources (not shown in the figures), are electrically connected to the metal bars in each of the first outer wire mesh 102, the second outer wire mesh 104, and inner wire mesh 103. Preferably, the first outer wire mesh 102 and second outer wire mesh 104 are both at a ground potential and the inner wire mesh 103 has a voltage $\Delta V$ with respect to the ground. Preferably, the voltage $\Delta V$ is a negative voltage.

FIGS. 11A and 11B illustrate an example of the quadrupole electric field pattern 116 in a localized region of the charged particle beam emittance controller 100. The space proximate the conductive members ("electrodes") 112, 117 and 119 that generate the locally quadrupole field pattern 116 provides an electrostatic quadrupole lenslet 118.

Figure 12:
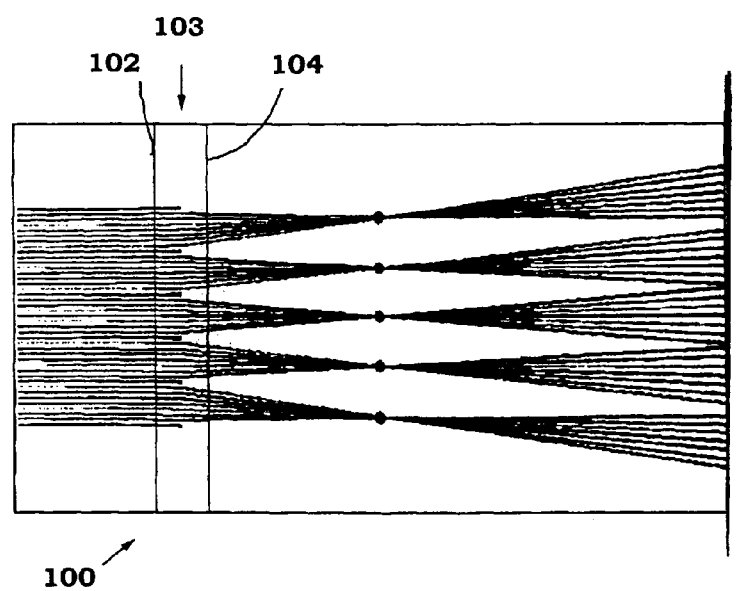
FIG. 12 illustrates results from a computer model of the effect of a charged particle beam emittance controller on an electron beam in a specific example of the invention.

FIG. 12 illustrates results obtained from the CPO3d computer model for a quadrupole array in which the spacing between meshes 102 and 103, and the spacing between meshes 103 and 104 is 0.5 mm and the metal bars within each of the meshes are 20 $\mu$m wide and spaced 200 $\mu$m apart. The outer meshes are grounded while the center mesh is at −4 kV. The focal distance in the orientation illustrated in FIG. 12 is less than 5 mm.

The focusing action of the electrostatic quadrupole lenslets is non-rotationally symmetric, which is different from the case of an aperture lens array. Adverse effects due to the non-rotational symmetry of the focusing action of the array of quadrupole lenslets of the charged particle beam emittance controller 100 were found to be sufficiently small when the focal lengths of the lenslets were small relative to the distance between the emittance controller 100 and the shaping aperture, which shaping aperture is defined as the plane being illuminated by the electron beam. The distance between the controller 100 and the shaping aperture should be just long enough to permit the individual beamlets coming out of the controller 100 to overlap and blend together, this creating a solid, uniform beam.

In operation, the quadrupole lenslets impose forces on the charged particles that act always in one direction, either towards or away from the beam axis, depending on the potential $\Delta V$ on the middle electrode and on the orientation of the lens. The focal lengths of the quadrupole lenslets advantageously depend on the electric field as a first order effect, whereas an aperture lens yields focusing action on the charged particles as a second order effect. Consequently, the quadrupole array of lenslets provides greater efficiency and leads to less of a problem with voltage breakdown between different electrodes within the lens area.

It should be understood that the figures included with this description are schematic and not necessarily to scale. Device configurations, etc., are not intended to convey any limitation on the device structures described here.

For the purpose of definition here, and in the appended claims, the term Wehnelt emitter is intended to define a solid metal body with an approximately flat emitting surface, said flat emitting surface being symmetrical, i.e., having the shape of a circle or regular polygon. Also for the purpose of definition, the term substrate is used herein to define the object plane of the electron beam exposure system whether or not there is a semiconductor workpiece present on that plane. The term electron optics plane may be used to describe an x-y plane in space in the electron gun and the surface onto which the electron beam image is focused, i.e., the object plane where the semiconductor wafer is situated.

As set forth above, in the present invention, an electron optical lens array is inserted into the illumination optics of the SCALPEL tool. The position of this lens array, or fly's eye lens, is such that each lenslet creates a beam cross-over with a smaller diameter d than the distance between the lenslets L, which increases the effective emittance of the beam by a factor $(L/d)^2$. The electron optical lens array is a mesh grid with an electrostatic field perpendicular to the grid. One advantage over conventional systems is that the present invention allows the use of a standard high brightness electron gun. Another advantage is that the effective emittance can be varied without stopping a large part of the electron current on beam shaping apertures which is now the only way to change the emittance. Yet another advantage is that a homogeneous illumination of the mask may be obtained.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An electron beam lithographic apparatus, comprising:
   a source of accelerated electrons;
   a condenser lens system disposed proximate said source of accelerated electrons, said condenser lens system adapted to alter paths of electrons emanating from said source of accelerated electrons to form a beam of electrons;

a mask holder constructed and arranged to hold a mask in a path of said beam of electrons; and a workpiece disposed in a path of electrons that have passed through said mask, said source of accelerated electrons comprising:
a cathode,
an anode disposed proximate said cathode, and
a charged-particle beam emittance controller disposed in an electron path between said cathode and said anode, said charged-particle beam emittance controller comprising a plurality of electrostatic quadrupole lenslets.

2. An electron beam lithographic apparatus according to claim 1, wherein said anode defines a drift tube, said charged-particle beam emittance controller being disposed in a drift space defined by said drift tube and being free from electrically-conductive connections between said charged-particle beam emittance controller and said drift tube.

3. An electron beam lithographic apparatus according to claim 1, wherein said source of accelerated electrons further comprises a Wehnelt electrode arranged between said anode and said cathode, wherein said charged-particle beam emittance controller is disposed in an aperture defined by said Wehnelt electrode and is free from electrically-conductive connections between said charged-particle beam emittance controller and said Wehnelt.

4. An electron beam lithographic apparatus according to claim 1, further comprising:

an objective lens system disposed between said mask and said workpiece;

a projection lens system disposed between said objective lens system and said workpiece; and a back focal plane filter disposed between said objective lens system and said projection lens system.

5. An electron beam lithographic apparatus according to claim 1, wherein said charged-particle beam emittance controller comprises:

a first outer wire mesh having a substantially planar form;

a second outer wire mesh having a substantially planar form and being arranged substantially parallel to said first outer wire mesh;

an inner wire mesh having a substantially planar form and being arranged between and substantially parallel to said first and second outer wire meshes; and a voltage source connected to at least one of said inner wire mesh, said first outer wire mesh and said second outer wire mesh such that a first voltage difference between said inner wire mesh and said first outer wire mesh is substantially equal to a second voltage difference between said inner wire mesh and said second outer wire mesh, said first and second wire meshes and said inner wire mesh defining said plurality of substantially coplanar electrostatic lenslets, and said plurality of substantially coplanar electrostatic lenslets generate substantially quadrupole electric field patterns at localized regions proximate each respective lenslet of said plurality of substantially coplanar electrostatic lenslets.

6. An electron beam lithographic apparatus according to claim 5, wherein said first outer wire mesh comprises a first plurality of conductive members each having a longitudinal axis, said first plurality of conductive members being aligned such that all longitudinal axes are substantially parallel to each other, wherein said second outer wire mesh comprises a second plurality of conductive members each having a longitudinal axis, said second plurality of conductive members being aligned such that all longitudinal axes of said second plurality of conductive members are substantially parallel to each other and are substantially parallel to said longitudinal axes of said first outer wire mesh, and wherein said inner wire mesh comprises a third plurality of conductive members each having a longitudinal axis, said third plurality of conductive members being aligned such that all longitudinal axes of said third plurality of conductive members are substantially parallel to each other and are substantially orthogonal to said longitudinal axes of said first and second outer wire meshes.

7. An electron beam lithographic apparatus according to claim 5, wherein said first and second outer wire meshes are grounded.

8. An electron beam lithographic apparatus according to claim 7, wherein said inner wire mesh is at a negative voltage.

9. An electron beam lithographic apparatus according to claim 6, wherein said first, second and third plurality of conductive members are metal wires having substantially uniform widths and thicknesses.

10. An electron beam lithographic apparatus according to claim 5, wherein a distance between said first outer wire mesh and said inner wire mesh is about equal to a distance between said second outer wire mesh and said inner wire mesh.

11. An electron source for an electron beam lithographic apparatus, comprising:

a cathode;
an anode disposed proximate said cathode; and
a charged-particle beam emittance controller disposed in a path of electrons emitted from said cathode and accelerated toward said anode, said charged-particle beam emittance controller comprising a plurality of electrostatic quadrupole lenslets.

12. An electron source for an electron beam lithographic apparatus according to claim 11, wherein said anode defines a drift tube, said charged-particle beam emittance controller being disposed in a drift space defined by said drift tube and being free from electrically-conductive connections between said charged-particle beam emittance controller and said drift tube.

13. An electron source for an electron beam lithographic apparatus according to claim 11, further comprising a Wehnelt electrode arranged between said anode and said cathode, wherein said charged-particle beam emittance controller is disposed in an aperture defined by said Wehnelt electrode and is free from electrically-conductive connections between said charged-particle beam emittance controller and said Wehnelt electrode.

14. An electron source for an electron beam lithographic apparatus according to claim 11, wherein said charged-particle beam emittance controller comprises:

a first outer wire mesh having a substantially planar form;

a second outer wire mesh having a substantially planar form and being arranged substantially parallel to said first outer wire mesh;

an inner wire mesh having a substantially planar form and being arranged between and substantially parallel to said first and second outer wire meshes; and a voltage source connected to at least one of said inner wire mesh, said first outer wire mesh and said second outer wire mesh such that a first voltage difference between said inner wire mesh and said first outer wire mesh is substantially equal to a second voltage difference between said inner wire mesh and said second outer wire mesh, said first and second wire meshes and said inner wire mesh defining said plurality of electrostatic quadrupole lenslets, and said plurality of electrostatic quadrupole lenslets generating substantially quadrupole electric field patterns at localized regions proximate each respective lenslet.

15. An electron source for an electron beam lithographic apparatus according to claim 14, wherein said first outer wire mesh comprises a first plurality of conductive members each having a longitudinal axis, said first plurality of conductive members being aligned such that all longitudinal axes are substantially parallel to each other, wherein said second outer wire mesh comprises a second plurality of conductive members each having a longitudinal axis, said second plurality of conductive members being aligned such that all longitudinal axes of said second plurality of conductive members are substantially parallel to each other and are substantially parallel to said longitudinal axes of said first outer wire mesh, and wherein said inner wire mesh comprises a third plurality of conductive members each having a longitudinal axis, said third plurality of conductive members being aligned such that all longitudinal axes of said third plurality of conductive members are substantially parallel to each other and are substantially orthogonal to said longitudinal axes of said first and second outer wire meshes.

16. An electron source for an electron beam lithographic apparatus according to claim 14, wherein said first and second outer wire meshes are grounded.

17. An electron source for an electron beam lithographic apparatus according to claim 14, wherein said inner wire mesh is at a negative voltage.

18. An electron source for an electron beam lithographic apparatus according to claim 15, wherein said first, second and third plurality of conductive members are metal bars having substantially uniform widths and thicknesses.

19. An electron source for an electron beam lithographic apparatus according to claim 14, wherein a distance between said first outer wire mesh and said inner wire mesh is about equal to a distance between said second outer wire mesh and said inner wire mesh.

20. A charged-particle beam emittance controller, comprising:

a first outer wire mesh having a substantially planar form;

a second outer wire mesh having a substantially planar form and being arranged substantially parallel to said first outer wire mesh;

an inner wire mesh having a substantially planar form and being arranged between and substantially parallel to said first and second outer wire meshes; and a voltage source connected to at least one of said inner wire mesh, said first outer wire mesh and said second outer wire mesh, such that a first voltage difference between said inner wire mesh and said first outer wire mesh is substantially equal to a second voltage difference between said inner wire mesh and said second outer wire mesh, said first and second wire meshes and said inner wire mesh defining a plurality of electrostatic lenslets that generate substantially quadrupole electric field patterns at localized regions proximate each respective lenslet.

21. A charged-particle beam emittance controller according to claim 20, wherein said first outer wire mesh comprises a first plurality of conductive members each having a longitudinal axis, said first plurality of conductive members being aligned such that all longitudinal axes are substantially parallel to each other, wherein said second outer wire mesh comprises a second plurality of conductive members each having a longitudinal axis, said second plurality of conductive members being aligned such that all longitudinal axes of said second plurality of conductive members are substantially parallel to each other and are substantially parallel to said longitudinal axes of said first outer wire mesh, and wherein said inner wire mesh comprises a third plurality of conductive members each having a longitudinal axis, said third plurality of conductive members being aligned such that all longitudinal axes of said third plurality of conductive members are substantially parallel to each other and are substantially orthogonal to said longitudinal axes of said first and second outer wire meshes.

22. A charged-particle beam emittance controller according to claim 20, wherein said first and second outer wire meshes are grounded.

23. A charged-particle beam emittance controller according to claim 22, wherein said inner wire mesh is at a negative voltage.

24. A charged-particle beam emittance controller according to claim 21, wherein said first, second and third plurality of conductive members are metal wires having substantially uniform widths and thicknesses.

25. A charged-particle beam emittance controller according to claim 20, wherein a distance between said first outer wire mesh and said inner wire mesh is about equal to a distance between said second outer wire mesh and said inner wire mesh.

26. A method of producing a semiconductor device, comprising:

generating a beam of charged particles;

passing said beam of charged particles through an array of quadrupole electrostatic field patterns;

illuminating a mask with said beam of charged particles, said mask having a pattern defined by regions which scatter charged particles more strongly than other regions of said mask; and exposing a semiconductor workpiece with charged particles from said beam of charged particles.

27. A method of producing a semiconductor device according to claim 26, further comprising:

focusing a plurality of said charged particles that have passed through said mask before said plurality of said charged particles reach said semiconductor workpiece;

filtering said plurality of said charged particles substantially at a focal plane resulting from said focusing based on deviations of respective charged particles from a beam axis of said beam of charged particles; and projecting a filtered image of said mask onto said semiconductor workpiece.

28. A method of producing a semiconductor device according to claim 27, wherein said filtering said plurality of said charged particles includes placing an aperture stop substantially at said focal plane, said aperture stop having a substantially circular aperture substantially centered on said beam axis of said beam of charged particles.

29. A method of producing a semiconductor device according to claim 27, wherein said filtering said plurality of said charged particles includes placing an aperture stop substantially at said focal plane, said aperture stop having a substantially circular charged particle beam attenuating region substantially centered on said beam axis of said beam of charged particles and regions substantially transparent to charged particles surrounding said attenuating region.

30. A method of producing a semiconductor device according to claim 26, wherein said beam of charged particles is a beam of electrons.

31. A method of producing a semiconductor device according to claim 26, wherein said array of quadrupole electrostatic field patterns are a substantially coplanar array of electrostatic lenslets arranged substantially orthogonal to a beam axis of said beam of charged particles.

32. A method of producing a semiconductor device according to claim 31, wherein said substantially coplanar array of electrostatic lenslets comprises a wire mesh assembly disposed in said charged-particle beam, said wire mesh assembly comprising an inner wire mesh arranged between first and second outer wire meshes.

33. A method of producing a semiconductor device according to claim 32, wherein said substantially coplanar array of electrostatic lenslets has a first voltage difference between said first outer wire mesh and said inner wire mesh, and a second voltage difference between said second outer wire mesh and said inner wire mesh, said first and second voltage differences being substantially equal.

34. A method of producing a semiconductor device according to claim 33, wherein said first outer wire mesh comprises a first plurality of conductive members each having a longitudinal axis, said first plurality of conductive members being aligned such that all longitudinal axes are substantially parallel to each other, wherein said second outer wire mesh comprises a second plurality of conductive members each having a longitudinal axis, said second plurality of conductive members being aligned such that all longitudinal axes of said second plurality of conductive members are substantially parallel to each other and are substantially parallel to said longitudinal axes of said first outer wire mesh, wherein said inner wire mesh comprises a third plurality of conductive members each having a longitudinal axis, said third plurality of conductive members being aligned such that all longitudinal axes of said third plurality of conductive members are substantially parallel to each other and are substantially orthogonal to said longitudinal axes of said first and second outer wire meshes, and wherein localized regions of said first and second outer wire meshes and said inner wire mesh act in cooperation with said applied voltage differences to generate said locally quadrupole electrostatic field pattern.

35. A method of controlling an emittance of a charged-particle beam in a semiconductor manufacturing operation, comprising:
generating a charged-particle beam; and
passing said charged-particle beam through an array of quadrupole electrostatic field patterns.

36. A method of controlling an emittance of a charged-particle beam according to claim 35, wherein said array of quadrupole electrostatic lenslets comprises a wire mesh assembly disposed in said charged-particle beam, said wire mesh assembly comprising an inner wire mesh arranged between first and second outer wire meshes.

37. A method of controlling an emittance of a charged-particle beam according to claim 36, wherein said array of quadrupole electrostatic lenslets comprises a first voltage difference between said first outer wire mesh and said inner wire mesh, and a second voltage difference between said second outer wire mesh and said inner wire mesh, said first and second voltage differences being substantially equal.

38. A method of controlling an emittance of a charged-particle beam according to claim 37, wherein said first outer wire mesh comprises a first plurality of conductive members each having a longitudinal axis, said first plurality of conductive members being aligned such that all longitudinal axes are substantially parallel to each other, wherein said second outer wire mesh comprises a second plurality of conductive members each having a longitudinal axis, said second plurality of conductive members being aligned such that all longitudinal axes of said second plurality of conductive members are substantially parallel to each other and are substantially parallel to said longitudinal axes of said first outer wire mesh, wherein said inner wire mesh comprises a third plurality of conductive members each having a longitudinal axis, said third plurality of conductive members being aligned such that all longitudinal axes of said third plurality of conductive members are substantially parallel to each other and are substantially orthogonal to said longitudinal axes of said first and second outer wire meshes, and wherein localized regions of said first and second outer wire meshes and said inner wire mesh act in cooperation with said applied voltage differences to generate said locally quadrupole electrostatic field pattern.

39. A method of controlling an emittance of a charged-particle beam according to claim 35, wherein said charged-particle beam is an electron beam.

40. A charged particle beam source and controller, comprising:
a cathode;
an anode disposed proximate said cathode; and
a beam controller disposed between said anode and said cathode,
said beam controller comprising:
a first outer wire mesh having a substantially planar form,
a second outer wire mesh having a substantially planar form and being
arranged substantially parallel to said first outer wire mesh, and
an inner wire mesh having a substantially planar form and being arranged between and substantially parallel to said first and second outer wire meshes,
each of said wire meshes comprising a plurality of parallel wires spaced apart, wherein said parallel wires of said first outer wire mesh and said parallel wires of second outer wire mesh extend in a first axial direction, and said parallel wires of said inner wire mesh extend in a second axial direction generally perpendicular to said first direction,
said first and second outer wire meshes being at a first electric potential and said inner wire mesh being at a second electric potential different from said first electric potential.

* * * * *